US011183715B2

(12) United States Patent
Park et al.

(10) Patent No.: US 11,183,715 B2
(45) Date of Patent: Nov. 23, 2021

(54) METHOD AND APPARATUS FOR ESTIMATING STATE OF BATTERY

(71) Applicant: Samsung Electronics Co., Ltd., Suwon-si (KR)

(72) Inventors: Jeonghyun Park, Seoul (KR); Young Hun Sung, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 509 days.

(21) Appl. No.: 16/019,736

(22) Filed: Jun. 27, 2018

(65) Prior Publication Data

US 2019/0165432 A1 May 30, 2019

(30) Foreign Application Priority Data

Nov. 28, 2017 (KR) .................. 10-2017-0160208

(51) Int. Cl.
| H01M 10/48 | (2006.01) |
| G01R 19/165 | (2006.01) |
| H01M 10/42 | (2006.01) |
| G06N 3/08 | (2006.01) |
| G01R 31/387 | (2019.01) |
| G01R 31/392 | (2019.01) |

(Continued)

(52) U.S. Cl.
CPC ...... *H01M 10/48* (2013.01); *G01R 19/16542* (2013.01); *G01R 31/367* (2019.01); *G01R 31/387* (2019.01); *G01R 31/3828* (2019.01); *G01R 31/392* (2019.01); *G06N 3/08* (2013.01); *H01M 10/425* (2013.01); *H01M 2010/4271* (2013.01)

(58) Field of Classification Search
CPC .............. H01M 10/48; H01M 10/425; H01M 10/4271; G01R 31/367; G01R 31/392; G01R 31/387; G01R 31/3828; G06N 3/08; G06N 3/0454
See application file for complete search history.

(56) References Cited

U.S. PATENT DOCUMENTS 7,902,793 B2 * 3/2011 Frey ..................... G01R 31/389
                                                              320/132
9,203,122 B2 * 12/2015 Raghavan ............. H01M 10/48
9,620,338 B2 * 4/2017 Samukawa ......... H01J 37/3299
(Continued)

FOREIGN PATENT DOCUMENTS

JP        4749685 B2    8/2011
JP        5862836 B2    2/2016
(Continued)

OTHER PUBLICATIONS

S. Chacko and et al, "Thermal modelling of Li-ion polymer battery for electric vehicle drive cycles", Journal of Power Sources 213 (2012) 296-303 (Year: 2012).*
(Continued)

*Primary Examiner* — Douglas Kay
(74) *Attorney, Agent, or Firm* — NSIP Law

(57) ABSTRACT

Disclosed is a method and apparatus for estimating a state of a battery, the method including setting a section in a sensing data sequence of a battery, extracting sensing data from the set section, and determining items of internal state information of the battery based on the extracted sensing data and estimators.

22 Claims, 12 Drawing Sheets

(51) Int. Cl.
*G01R 31/3828* (2019.01)
*G01R 31/367* (2019.01)

(56) References Cited

U.S. PATENT DOCUMENTS

| | | | |
|---|---|---|---|
| 2006/0284617 A1 | 12/2006 | Kozlowski et al. | |
| 2008/0258734 A1* | 10/2008 | Frey | G01R 31/389 324/430 |
| 2011/0250478 A1* | 10/2011 | Timmons | H01M 4/587 429/91 |
| 2013/0013253 A1* | 1/2013 | Samukawa | H01J 37/32935 702/167 |
| 2013/0119921 A1* | 5/2013 | Choe | H01M 10/44 320/106 |
| 2014/0092375 A1* | 4/2014 | Raghavan | H01M 10/48 356/32 |
| 2015/0042291 A1* | 2/2015 | Racine | H02J 7/0047 320/137 |
| 2016/0018472 A1* | 1/2016 | Sung | G01R 31/367 702/63 |
| 2016/0141730 A1* | 5/2016 | Shin | H01M 2/1022 429/7 |
| 2016/0231386 A1* | 8/2016 | Sung | G01R 31/367 |
| 2016/0239592 A1 | 8/2016 | Pourmousavi Kani | |
| 2018/0026454 A1* | 1/2018 | Belkacem-Boussaid | H02J 7/34 702/63 |
| 2018/0203070 A1 | 7/2018 | Park | |
| 2018/0219263 A1* | 8/2018 | Honkura | H02J 7/0072 |

FOREIGN PATENT DOCUMENTS

| | | |
|---|---|---|
| JP | 5971477 B2 | 8/2016 |
| KR | 10-0793616 B1 | 1/2008 |
| KR | 10-2016-0000317 A | 1/2016 |
| KR | 10-2017-0050655 A | 5/2017 |
| WO | WO-2019073000 A1 * | 4/2019 ............ G06F 21/53 |

OTHER PUBLICATIONS

K. H. Kwon and et al, "A two-dimensional modeling of a lithium-polymer battery", Journal of Power Sources 163 (2006) 151-157 (Year: 2006).*

* cited by examiner

100

METHOD AND APPARATUS FOR ESTIMATING STATE OF BATTERY

CROSS-REFERENCE TO RELATED APPLICATIONS

This application claims the benefit under 35 USC § 119(a) of Korean Patent Application No. 10-2017-0160208 filed on Nov. 28, 2017 in the Korean Intellectual Property Office, the entire disclosure of which is incorporated herein by reference for all purposes.

BACKGROUND

1. Field

The following description relates to battery state estimation.

2. Description of Related Art

An electrochemical and thermal model may estimate an internal state of a battery. The electrochemical and thermal model may be obtained by modeling a relationship between an oxidation/reduction reaction due to an electron transfer between materials included in the battery and additional phenomena that are affected by the oxidation/reduction reaction. The electrochemical and thermal model may estimate the internal state of the battery through a complicated calculation process, and thus, use a relative large amount of time for estimation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of estimating a state of a battery, the method including setting a section in a sensing data sequence of a battery, extracting sensing data from the set section, and determining items of internal state information of the battery using estimators based on the extracted sensing data, wherein each of the estimators is configured to determine internal state information corresponding to an individual estimation target from among the items of internal state information. The individual estimation target may include at least one of a current density of the battery, a potential of the battery, and an ion density of the battery.

The estimators may include a current density estimator configured to estimate a current density of the battery based on the extracted sensing data, a potential estimator configured to estimate a potential of the battery based on the extracted sensing data, and an ion density estimator configured to estimate an ion density of the battery based on the extracted sensing data.

The estimators may include a negative current density estimator configured to estimate a current density of a negative electrode of the battery based on the extracted sensing data, a positive current density estimator configured to estimate a current density of a positive electrode of the battery based on the extracted sensing data, a negative potential estimator configured to estimate a potential of the negative electrode based on the extracted sensing data, a positive potential estimator configured to estimate a potential of the positive electrode based on the extracted sensing data, a negative ion density estimator configured to estimate an ion density of the negative electrode based on the extracted sensing data, and a positive ion density estimator configured to estimate an ion density of the positive electrode based on the extracted sensing data.

The method of claim 1, wherein the estimators may include discharged-state estimators configured to determine discharge-state items of internal state information of the battery from sensing data extracted from a sensing data sequence while the battery is discharged, and charged-state estimators configured to determine charge-state items of internal state information of the battery from sensing data extracted from a sensing data sequence while the battery is charged.

The discharged-state estimators may include discharge-state current density estimators configured to estimate current densities of a negative electrode and a positive electrode of the battery while the battery is discharged, discharge-state potential estimators configured to estimate potentials of the negative electrode and the positive electrode of the battery while the battery is discharged, and discharge-state ion density estimators configured to estimate ion densities of the negative electrode and the positive electrode of the battery while the battery is discharged, and the charged-state estimators may include charge-state current density estimators configured to estimate current densities of a negative electrode and a positive electrode of the battery while the battery is charged, charge-state potential estimators configured to estimate potentials of the negative electrode and the positive electrode of the battery while the battery is charged, and charge-state ion density estimators configured to estimate ion densities of the negative electrode and the positive electrode of the battery while the battery is charged.

Each of the estimators may be based on a neural network.

The determining of the items of internal state information may include determining the internal state information in response to the battery being charged based on individually estimating current densities of a negative electrode and a positive electrode of the battery, potentials of the negative electrode and the positive electrode, and ion densities of the negative electrode and the positive electrode using the estimators based on sensing data extracted from a sensing data sequence during the charging of the battery, and integrating the estimated current densities of the negative electrode and the positive electrode, integrating the estimated potentials of the negative electrode and the positive electrode, and integrating the estimated ion densities of the negative electrode and the positive electrode.

The determining of the internal state information may include determining the internal state information in response to the battery being discharged based on individually estimating current densities of a negative electrode and a positive electrode of the battery, potentials of the negative electrode and the positive electrode, and ion densities of the negative electrode and the positive electrode using the estimators based on sensing data extracted from a sensing data sequence during the discharging of the battery, and integrating the estimated current densities of the negative electrode and the positive electrode, integrating the estimated potentials of the negative electrode and the positive electrode, and integrating the estimated ion densities of the negative electrode and the positive electrode.

The method may include determining at least one of state of charging (SoC) information or state of health (SoH)

information of the battery based on any one or any combination of the items of internal state information.

In another general aspect, there is provided an apparatus for estimating a state of a battery, the apparatus including a processor configured to set a section in a sensing data sequence of a battery, to extract sensing data from the set section, and to determine items of internal state information of the battery using estimators based on the extracted sensing data, wherein each of the estimators is configured to determine internal state information corresponding to an individual estimation target from among the items of internal state information. The individual estimation target may include at least one of a current density of the battery, a potential of the battery, and an ion density of the battery.

The estimators may include a current density estimator configured to estimate a current density of the battery based on the extracted sensing data, a potential estimator configured to estimate a potential of the battery based on the extracted sensing data, and an ion density estimator configured to estimate an ion density of the battery based on the extracted sensing data.

The estimators may include a negative current density estimator configured to estimate a current density of a negative electrode of the battery based on the extracted sensing data, a positive current density estimator configured to estimate a current density of a positive electrode of the battery based on the extracted sensing data, a negative potential estimator configured to estimate a potential of the negative electrode based on the extracted sensing data, a positive potential estimator configured to estimate a potential of the positive electrode based on the extracted sensing data, a negative ion density estimator configured to estimate an ion density of the negative electrode based on the extracted sensing data, and a positive ion density estimator configured to estimate an ion density of the positive electrode based on the extracted sensing data.

The estimators may include discharged-state estimators configured to determine discharge-state items of internal state information of the battery from sensing data extracted from a sensing data sequence while the battery is discharged, and charged-state estimators configured to determine charge-state items of internal state information of the battery from sensing data extracted from a sensing data sequence while the battery is charged.

The discharged-state estimators may include discharge-state current density estimators configured to estimate current densities of a negative electrode and a positive electrode of the battery while the battery is discharged, discharge-state potential estimators configured to estimate potentials of the negative electrode and the positive electrode of the battery while the battery is discharged, and discharge-state ion density estimators configured to estimate ion densities of the negative electrode and the positive electrode of the battery while the battery is discharged, and the charged-state estimators may include charge-state current density estimators configured to estimate current densities of a negative electrode and a positive electrode of the battery while the battery is charged, charge-state potential estimators configured to estimate potentials of the negative electrode and the positive electrode of the battery while the battery is charged, and charge-state ion density estimators configured to estimate ion densities of the negative electrode and the positive electrode of the battery while the battery is charged.

Each of the estimators may be based on a neural network.

In response to the battery being charged, the processor may be configured to individually estimate current densities of a negative electrode and a positive electrode of the battery, potentials of the negative electrode and the positive electrode, and ion densities of the negative electrode and the positive electrode using the estimators based on sensing data extracted from a sensing data sequence during the charging of the battery, and integrate the estimated current densities of the negative electrode and the positive electrode, integrate the estimated potentials of the negative electrode and the positive electrode, and integrate the estimated ion densities of the negative electrode and the positive electrode.

In response to the battery being discharged, the processor may be configured to individually estimate current densities of a negative electrode and a positive electrode of the battery, potentials of the negative electrode and the positive electrode, and ion densities of the negative electrode and the positive electrode using the estimators based on sensing data extracted from a sensing data sequence during the discharging of the battery, and integrate the estimated current densities of the negative electrode and the positive electrode, integrate the estimated potentials of the negative electrode and the positive electrode, and integrate the estimated ion densities of the negative electrode and the positive electrode.

The processor may be configured to determine at least one of state of charging (SoC) information or state of health (SoH) information of the battery based on any one or any combination of the items of internal state information.

The processor may be configured to normalize and filter the extracted sensing data.

The processor may be configured to determine that the battery is charged based on a current value in the extracted sensing data being greater than or equal to a threshold.

The processor may be configured to determine that the battery is discharged based on a current value in the extracted sensing data being lesser than a threshold.

The processor may be configured to determine the charge state of the battery, in response to receiving a signal from another device.

The apparatus may include a memory configured to store training data to train the neural network through supervised learning based on the training data and reference data on internal variables of a reference battery.

Other features and aspects will be apparent from the following detailed description, the drawings, and the claims.

Figure 1:
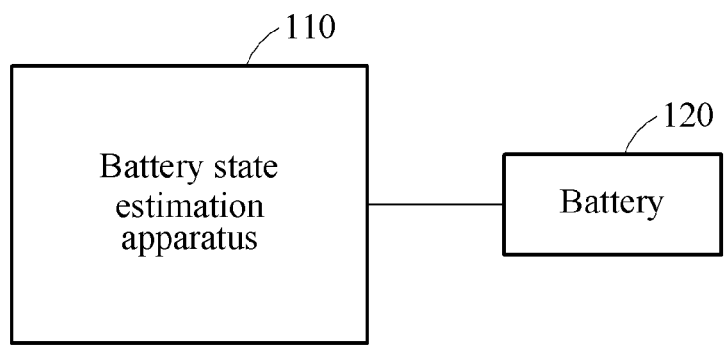
FIG. 1 illustrates an example of a battery apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only, and is not to be used to limit the disclosure. The articles "a," "an," and "the" are intended to include the plural forms as well, unless the context clearly indicates otherwise.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

FIG. 1 illustrates an example of a battery system.

Referring to FIG. 1, a battery apparatus 100 includes a battery state estimation apparatus 110 and a battery 120.

The battery 120 indicates, for example, a battery cell, a battery module, and a battery pack.

In an example, the battery state estimation apparatus 110 sets a section in a sensing data sequence of the battery 120. The sensing data sequence is a series of sensing data indexed in a time order or having a time index. The sensing data sequence includes any one or any combination of, for example, a voltage data sequence, a current data sequence, and a temperature data sequence of the battery 120.

In an example, the battery state estimation apparatus 110 extracts sensing data in the section set in the sensing data sequence.

In an example, the battery state estimation apparatus 110 determines a plurality of items of internal state information of the battery 120 based on the extracted sensing data using estimators. The plurality of items of internal state information of the battery 120 includes any one or any combination of, for example, a current density, a potential, and an ion density of the battery 120. The battery state estimation apparatus 110 estimates the current density of the battery 120 based on the extracted sensing data using an estimator, estimates the potential of the battery 120 based on the extracted sensing data using a second estimator, and estimates the ion density of the battery 120 based on the extracted sensing data using another estimator.

Figure 2:
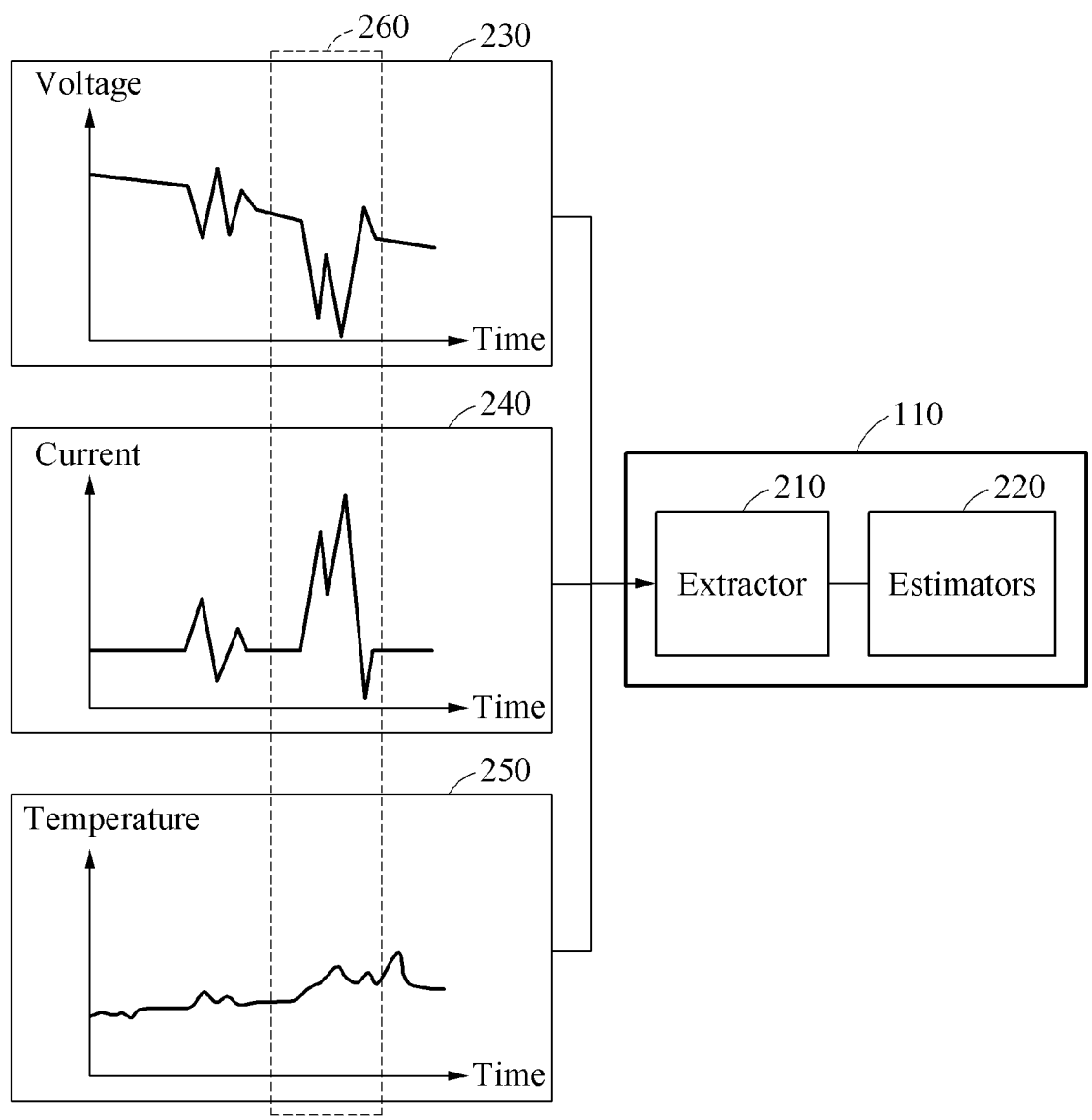
FIG. 2 illustrates an example of an operation of a battery state estimation apparatus.

FIG. 2 illustrates an example of an operation of a battery state estimation apparatus.

Referring to FIG. 2, the battery state estimation apparatus 110 includes an extractor 210 and estimators 220.

The battery state estimation apparatus 110 senses the battery 120 using at least one sensor and sequentially stores sensing data in a buffer or a memory for each time that the sensing data is generated by sensing the battery 120. Through this, a sensing data sequence of the battery 120 is stored in the buffer or the memory. The battery state estimation apparatus 110 senses a voltage of the battery 120 using a voltage sensor and sequentially stores voltage data corresponding to a result of the sensing in the buffer or the memory. Thus, a voltage data sequence 230 is stored in the buffer or the memory. Likewise, a current data sequence 240 corresponding to a result obtained by sensing a current of the battery 120 and a temperature data sequence 250 corresponding to a result obtained by sensing a temperature of the battery 120 are stored in the buffer or the memory.

The extractor 210 sets a section in the sensing data sequence of the battery 120 and extracts sensing data from the set section. As illustrated in FIG. 2, the extractor 210 sets a section 260 in the voltage data sequence 230, the current data sequence 240, and the temperature data sequence 250 and extracts voltage data, current data, and temperature data from the section 260.

In an example, the extractor 210 preprocesses the extracted sensing data. In an example, the extractor 210 performs normalization on each of the extracted voltage data, the extracted current data, and the extracted temperature data. Normalization is performed, not only to equalize a number of items of the extracted voltage data, a number of items of the extracted current data, and a number of items of the extracted temperature data, but also to equalize the extracted voltage data, the extracted current data, and the extracted temperature data, which are different in absolute numerical range from one another. In another example, the extractor 210 performs filtering on each of the extracted voltage data, the extracted current data, and the extracted temperature data to remove noise from the extracted voltage data, the extracted current data, and the extracted temperature data. Depending on examples, the extractor 210 performs both the normalization and the filtering.

The estimators 220 determine a plurality of items of internal state information of the battery 120 based on the extracted sensing data. Each of the estimators 220 is based on, for example, a neural network model. As further discussed with reference to FIG. 11, the neural network model corresponding to a basis of each of the estimators 220 is trained in a training phase. Through the training, which internal state information of the battery 120 is to be determined is defined for each of the estimators 220. Each of the estimators 220 determines internal state information corresponding to a target for estimation based on the extracted sensing data. The target for estimation may include at least one of a current density of the battery, a potential of the battery, and an ion density of the battery.

The estimators 220 will be further described with reference to FIGS. 3A through 6.

FIGS. 3A through 6 illustrate examples of estimators in a battery state estimation apparatus.

Figure 3A:
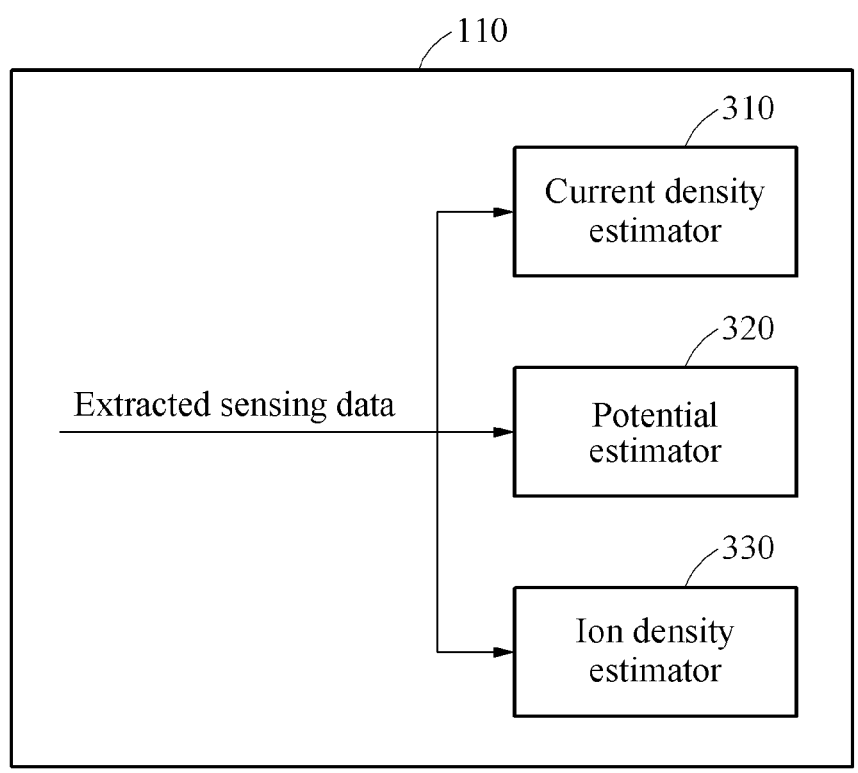
FIGS. 3A through 6 illustrate examples of estimators in a battery state estimation apparatus.

Referring to FIG. 3A, the estimators 220 include a current density estimator 310, a potential estimator 320, and an ion density estimator 330.

The current density estimator 310 estimates a current density of an electrode of the battery 120 from extracted sensing data.

The potential estimator 320 estimates a potential of the electrode of the battery 120 from extracted sensing data.

The ion density estimator 330 estimates an ion density of the electrode of the battery 120 from extracted sensing data. When the battery 120 is a lithium ion battery, the ion density estimator 330 estimates a lithium ion density of the electrode based on extracted sensing data.

Figure 3B:
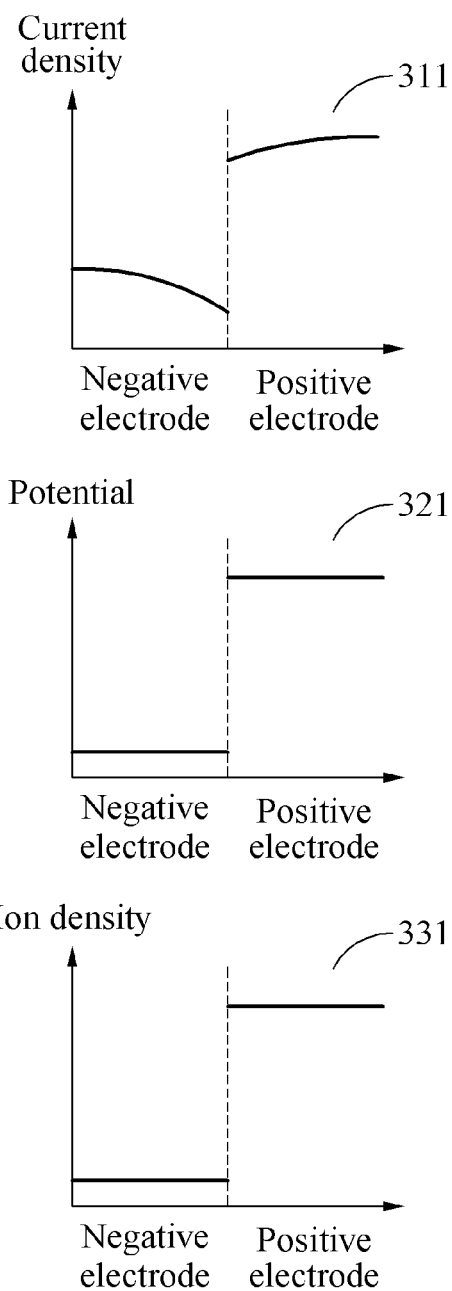

FIG. 3B illustrates the current density estimator 310, the potential estimator 320, and the ion density estimator 330 and graphs 311, 321, and 331 representing estimation results of the current density estimator 310, the potential estimator 320, and the ion density estimator 330.

As described with reference to FIGS. 3A and 3B, the current density estimator 310, the potential estimator 320, and the ion density estimator 330 are used while the battery 120 is charged and discharged. In other words, the current density estimator 310, the potential estimator 320, and the ion density estimator 330 are used without distinction between charging and discharging of the battery 120. Unlike the examples of FIGS. 3A and 3B, estimators used while the battery 120 is discharged may differ from estimators used while the battery is discharged. Related description will be provided with reference to FIG. 4.

Figure 4:
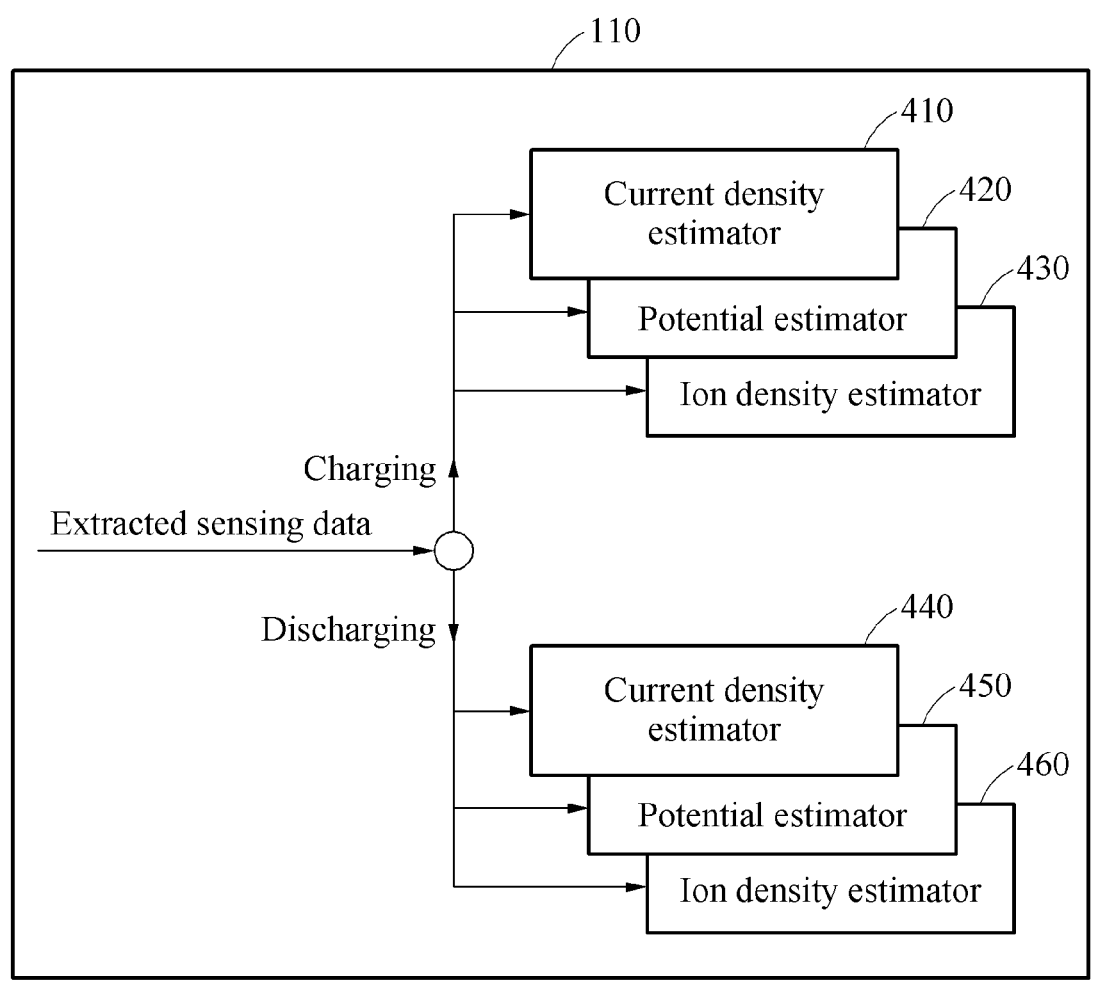

Referring to FIG. 4, estimators 410, 420, and 430 used while the battery 120 is charged differ from estimators 440, 450, and 460 used while the battery 120 is discharged. The estimators 410, 420, and 430 are also referred to as, for example, a current density estimator 410, a potential estimator 420, and an ion density estimator 430, respectively. Also, the estimators 440, 450, and 460 are also referred to as, for example, a current density estimator 440, a potential estimator 450, and an ion density estimator 460, respectively. The estimators 410, 420, and 430 correspond to charged-state estimators that determine a plurality of items of internal state information of the battery 120 while the battery 120 is charged. The estimators 440, 450, and 460 correspond to discharged-state estimators that determine a plurality of items of internal state information of the battery 120 while the battery 120 is discharged.

The battery state estimation apparatus 110 determines whether the battery 120 is charged. In an example, the battery state estimation apparatus 110 verifies whether a current value included in extracted sensing data is greater than or equal to a preset value, for example, 0 to determine whether the battery 120 is charged or discharged. In this example, when the current value is less than 0, the battery state estimation apparatus 110 determines that the battery 120 is discharged. In another example, when a signal indicating that the battery is charged is received from another device, for example, an electronic control unit (ECU) or a vehicle control unit (VCU) of a vehicle, the battery state estimation apparatus 110 determines that the battery 120 is charged. When the signal is not received, the battery state estimation apparatus 110 determines that the battery 120 is discharged.

While the battery 120 is charged, the battery state estimation apparatus 110 determines a plurality of items of internal state information of the battery 120 using sensing data extracted by the extractor 210 and the estimators 410, 420, and 430. In the example of FIG. 4, the estimators 410, 420, and 430 receive sensing data extracted from a sensing data sequence obtained while the battery 120 is charged, from the extractor 210 as an input. The current density estimator 410 estimates a current density of an electrode based on the received sensing data while the battery 120 is charged. The potential estimator 420 estimates a potential of the electrode based on the received sensing data while the battery 120 is charged. The ion density estimator 430 estimates an ion density, for example, a lithium ion density of the electrode based on the received sensing data while the battery 120 is charged.

While the battery 120 is discharged, the battery state estimation apparatus 110 determines a plurality of items of internal state information of the battery 120 using sensing data extracted by the extractor 210 and the estimators 440, 450, and 460. In the example of FIG. 4, the estimators 440, 450, and 460 receive sensing data extracted from a sensing data sequence obtained while the battery 120 is discharged, from the extractor 210 as an input. The current density estimator 440 estimates a current density of an electrode based on the received sensing data while the battery 120 is discharged. The potential estimator 150 estimates a potential of the electrode based on the received sensing data while the battery 120 is discharged. The ion density estimator 460 estimates an ion density, for example, a lithium ion density of the electrode based on the received sensing data while the battery 120 is discharged.

As further discussed with reference to FIG. 11, the estimators 410 through 460 are trained in a training phase. Through the training, the estimators 410, 420, and 430 independently and/or individually estimate the current density, the potential, and the ion density of the electrode based on the received input while the battery 120 is charged. Also, the estimators 440, 450, and 460 independently and/or individually estimate the current density, the potential, and the ion density of the electrode based on the received input while the battery 120 is discharged.

The current density estimator 310, the potential estimator 320, and the ion density estimator 330 of FIGS. 3A and 3B estimate a current density, a potential, and an ion density of a positive electrode of the battery 120 and a current density, a potential, and an ion density of a negative electrode of the battery 120. The current densities of the positive electrode and the negative electrode of the battery 120 are estimated using the same estimator, for example, the current density estimator 310. Likewise, the potentials of the positive electrode and the negative electrode of the battery 120 are estimated using the same estimator, for example, the potential estimator 320 and the ion densities of the positive electrode and the negative electrode of the battery 120 are estimated using the same estimator, for example, the ion density estimator 330. Unlike the examples of FIGS. 3A and 3B, estimators used to estimate the current density, the potential, and the ion density of the positive electrode of the battery 120 differ from estimators used to estimate the current density, the potential, and the ion density of the negative electrode of the battery 120. Related description will be provided with reference to FIG. 5.

Figure 5:
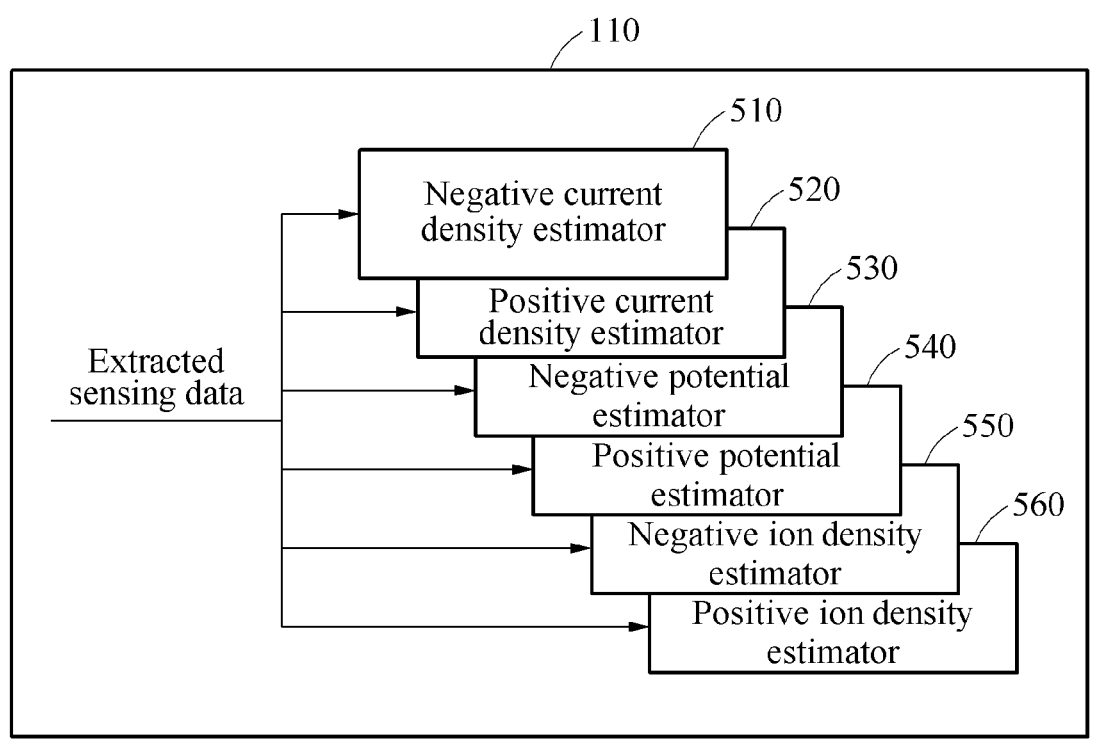

Referring to FIG. 5, the estimators 220 include a negative current density estimator 510, a positive current density estimator 520, a negative potential estimator 530, a positive potential estimator 540, a negative ion density estimator 550, and a positive ion density estimator 560.

The negative current density estimator 510 estimates a current density of a negative electrode of the battery 120 based on extracted sensing data. The positive current density estimator 520 estimates a current density of a positive electrode of the battery 120 based on extracted sensing data.

The negative potential estimator 530 estimates a potential of the negative electrode of the battery 120 based on extracted sensing data. The positive potential estimator 540 estimates a potential of the positive electrode of the battery 120 based on extracted sensing data.

The negative ion density estimator 550 estimates an ion density, for example, a lithium ion density of the negative electrode of the battery 120 based on extracted sensing data. The positive ion density estimator 560 estimates an ion density, for example, a lithium ion density of the positive electrode of the battery 120 based on extracted sensing data.

The negative current density estimator 510, the positive current density estimator 520, the negative potential estimator 530, the positive potential estimator 540, the negative ion density estimator 550, and the positive ion density estimator 560 are trained in a training phase and thus, independently and/or individually estimate the current density of the negative electrode, the current density of the positive electrode, the potential of the negative electrode, the potential of the positive electrode, the ion density of the negative electrode, and the ion density of the positive electrode based on received inputs.

In the example of FIG. 5, the negative current density estimator 510, the positive current density estimator 520, the negative potential estimator 530, the positive potential estimator 540, the negative ion density estimator 550, and the positive ion density estimator 560 are used while the battery 120 is charged and while the battery 120 is discharged. In other words, the negative current density estimator 510, the positive current density estimator 520, the negative potential estimator 530, the positive potential estimator 540, the negative ion density estimator 550, and the positive ion density estimator 560 are used without distinction between charging and discharging of the battery 120. An example in which charging and discharging of the battery 120 are distinguished will be described with reference to FIG. 6.

Figure 6:
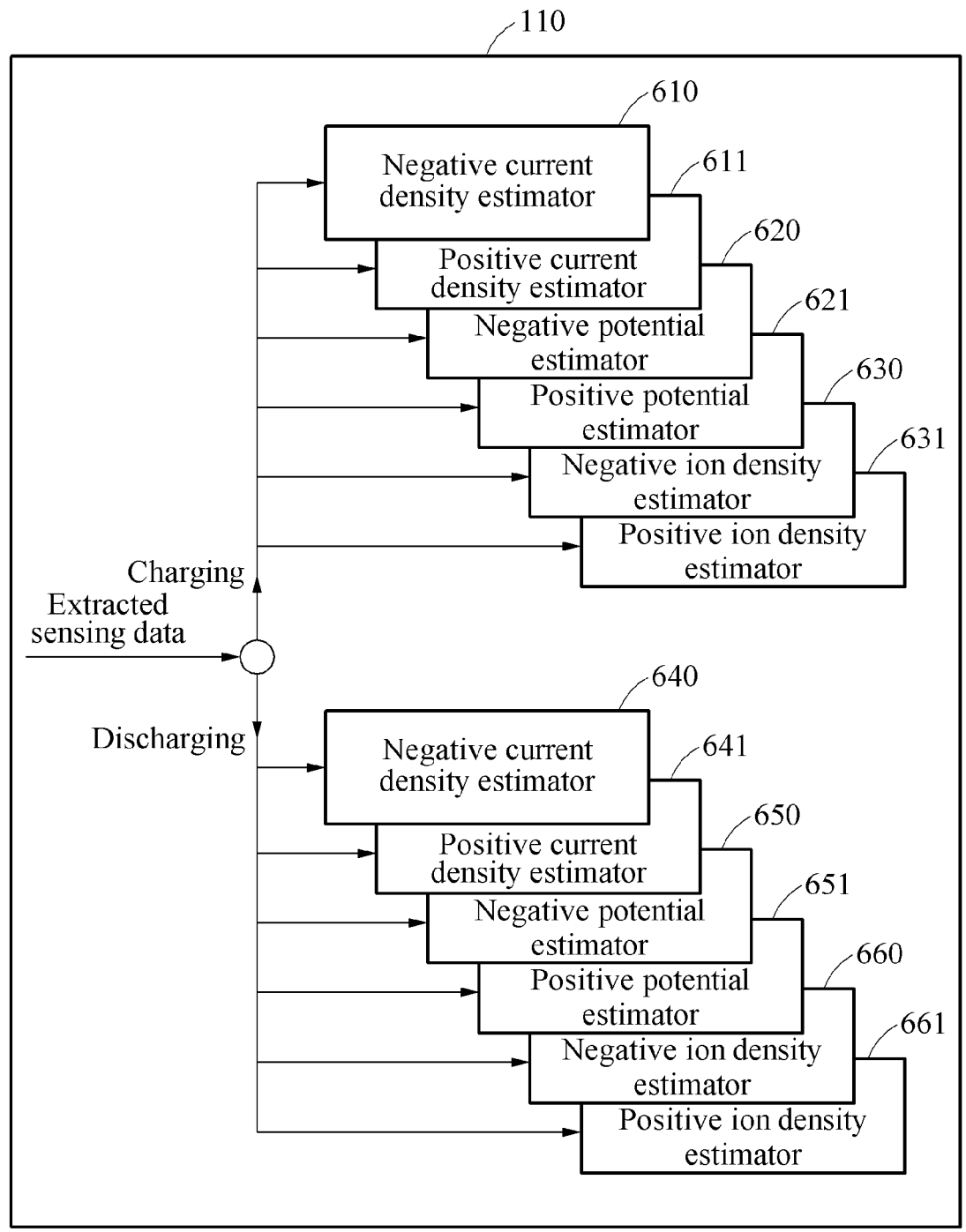

Referring to FIG. 6, estimators 610, 611, 620, 621, 630, and 631 and estimators 640, 641, 650, 651, 660, and 661 are classified based on charging and discharging of the battery 120. The estimators 610, 611, 620, 621, 630, and 631 correspond to, for example, charged-state estimators. The estimators 640, 641, 650, 651, 660, and 661 correspond to, for example, discharged-state estimators. The estimators 610, 611, 620, 621, 630, and 631 are also referred to as, for example, a negative current density estimator 610, a positive current density estimator 611, a negative potential estimator 620, a positive potential estimator 621, a negative ion density estimator 630, and a positive ion density estimator 631, respectively. Also, the estimators 640, 641, 650, 651, 660, and 661 are also referred to as, for example, a negative current density estimator 640, a positive current density estimator 641, a negative potential estimator 650, a positive potential estimator 651, a negative ion density estimator 660, and a positive ion density estimator 661, respectively.

While the battery 120 is charged, the battery state estimation apparatus 110 determines a plurality of items of internal state information of the battery 120 based on sensing data extracted from a sensing data sequence obtained during the charging of the battery 120 using the estimators 610, 611, 620, 621, 630, and 631. For example, the estimators 610, 611, 620, 621, 630, and 631 estimate a current density of a negative electrode of the battery 120 being charged, a current density of a positive electrode of the battery 120 being charged, a potential of the negative electrode, a potential of the positive electrode, an ion density of the negative electrode, an ion density of the positive electrode based on sensing data input from the extractor 210.

While the battery 120 is discharged, the battery state estimation apparatus 110 determines a plurality of items of internal state information of the battery 120 based on sensing data extracted from a sensing data sequence obtained during the discharging of the battery 120 using the estimators 640, 641, 650, 651, 660, and 661. For example, the estimators 640, 641, 650, 651, 660, and 661 estimate a current density of a negative electrode of the battery 120 being discharged, a current density of a positive electrode of the battery 120 being discharged, a potential of the negative electrode, a potential of the positive electrode, an ion density of the negative electrode, an ion density of the positive electrode based on sensing data input from the extractor 210.

In an example, the estimators 610, 611, 620, 621, 630, and 631 are trained in a training phase, and thus, independently and/or individually estimate the current density of the negative electrode, the current density of the positive electrode, the potential of the negative electrode, the potential of the positive electrode, the ion density of the negative electrode, and the ion density of the positive electrode based on received inputs while the battery 120 is charged. Similarly, in an example, the estimators 640, 641, 650, 651, 660, and 661 are trained in a training phase, and thus, independently and/or individually estimate the current density of the negative electrode, the current density of the positive electrode, the potential of the negative electrode, the potential of the positive electrode, the ion density of the negative electrode, and the ion density of the positive electrode based on received inputs while the battery 120 is discharged.

As described with reference to FIGS. 5 and 6, the battery state estimation apparatus 110 uses different estimators to estimate internal state information of a negative electrode and a positive electrode. In an example, the battery state estimation apparatus 110 may need to integrate the internal state information of a negative electrode and a positive electrode. Related description will be provided with reference to FIG. 7.

Figure 7:
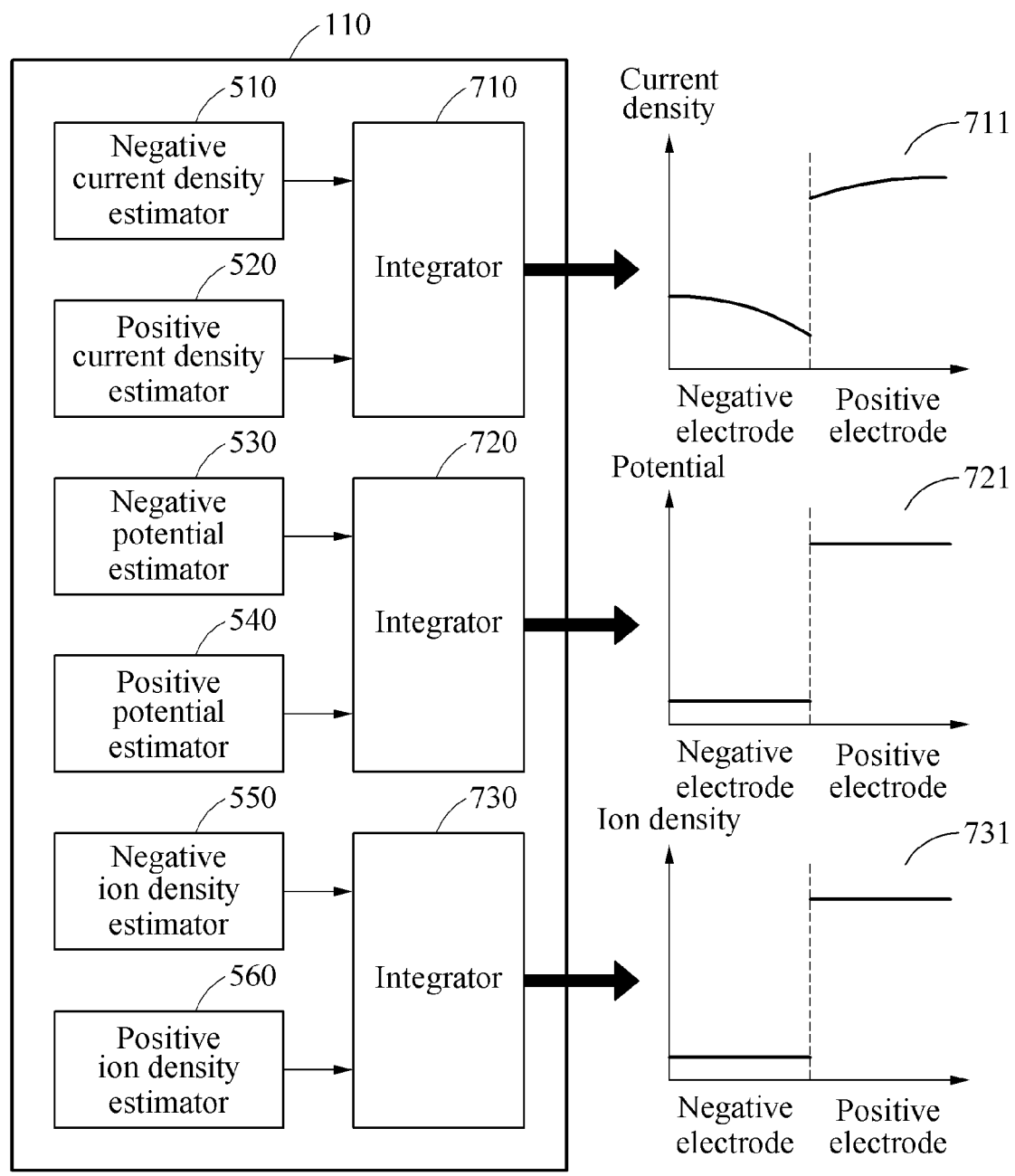
FIG. 7 illustrates an example of an integrator in a battery state estimation apparatus.

FIG. 7 illustrates an example of an integrator in a battery state estimation apparatus.

Referring to FIG. 7, the battery state estimation apparatus 110 further includes integrators 710 through 730. The integrators 710 through 730 are physically separated or logically separated in a single integrator.

The integrator 710 integrates an estimated current density of a negative electrode and an estimated current density of a positive electrode. Through this, the integrator 710 generates or obtains a current density graph 711 of all electrodes. While the battery 120 is charged, the integrator 710 integrates an estimation result of a negative current density estimator, for example, the estimator 610 and an estimation result of a positive current density estimator, for example, the estimator 611. While the battery 120 is discharged, the integrator 710 integrates an estimation result of a negative current density estimator, for example, the estimator 640 and an estimation result of a positive current density estimator, for example, the estimator 641.

The integrator 720 integrates an estimated potential of a negative electrode and an estimated potential of a positive electrode. Through this, the integrator 720 generates or obtains a potential graph 721 of all electrodes. While the battery 120 is charged, the integrator 720 integrates an estimation result of a negative potential estimator, for example, the estimator 620 and an estimation result of a positive potential estimator, for example, the estimator 621. While the battery 120 is discharged, the integrator 720 integrates an estimation result of a negative potential estimator, for example, the estimator 650 and an estimation result of a positive potential estimator, for example, the estimator 651.

The integrator 730 integrates an estimated ion density of a negative electrode and an estimated ion density of a positive electrode. Through this, the integrator 730 generates or obtains an ion density graph 731 of all electrodes. While the battery 120 is charged, the integrator 730 integrates an estimation result of a negative ion density estimator, for example, the estimator 630 and an estimation result of a positive ion density estimator, for example, the estimator 631. While the battery 120 is discharged, the integrator 730 integrates an estimation result of a negative ion density estimator, for example, the estimator 660 and an estimation result of a positive ion density estimator, for example, the estimator 661.

The descriptions of FIGS. 1 through 7 are merely examples and not to be taken as being limited thereto. In an example, the battery state estimation apparatus 110 may include an estimator to estimate an electrolyte ion density, for example, a lithium ion density of the battery 120.

Figure 8:
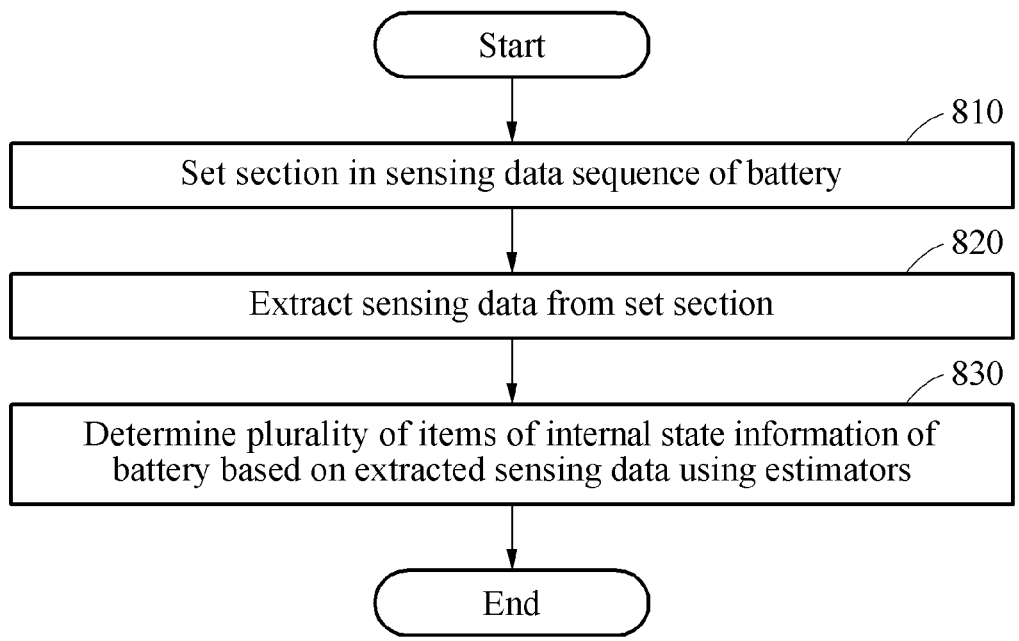
FIG. 8 illustrates an example of a battery state estimation method.

FIG. 8 illustrates an example of a battery state estimation method. The operations in FIG. 6 may be performed in the sequence and manner as shown, although the order of some operations may be changed or some of the operations omitted without departing from the spirit and scope of the illustrative examples described. Many of the operations shown in FIG. 8 may be performed in parallel or concurrently. One or more blocks of FIG. 6, and combinations of the blocks, can be implemented by special purpose hardware-based computer that perform the specified functions, or combinations of special purpose hardware and computer instructions.

In an example, a battery state estimation method is performed by the battery state estimation apparatus 110. In addition to the description of FIG. 6 below, the descriptions of FIGS. 1-5 are also applicable to FIG. 6, and are incorporated herein by reference. Thus, the above description may not be repeated here.

Referring to FIG. 8, in operation 810, the battery state estimation apparatus 110 sets a section in a sensing data sequence of the battery 120.

In operation 820, the battery state estimation apparatus 110 extracts sensing data from the set section.

In operation 830, the battery state estimation apparatus 110 determines a plurality of items of internal state information of the battery 120 based on the extracted sensing data using estimators.

The battery state estimation apparatus 110 determines whether an internal state of the battery 120 is abnormal based on any one or any combination of the items of internal state information. For example, the battery state estimation apparatus 110 compares the graphs 711, 721, and 731 to graphs obtained in a normal state. Also, the battery state estimation apparatus 110 determines whether the internal state is abnormal based on a result of the comparing.

The battery state estimation apparatus 110 determines charged-state information and/or life state information of the battery 120 based on any one or any combination of the items of internal state information. The charged-state information corresponds to, for example, a state of charge (SoC). The life state information corresponds to, for example, a state of health (SoH) and a remaining useful life (RUL).

Figure 9:
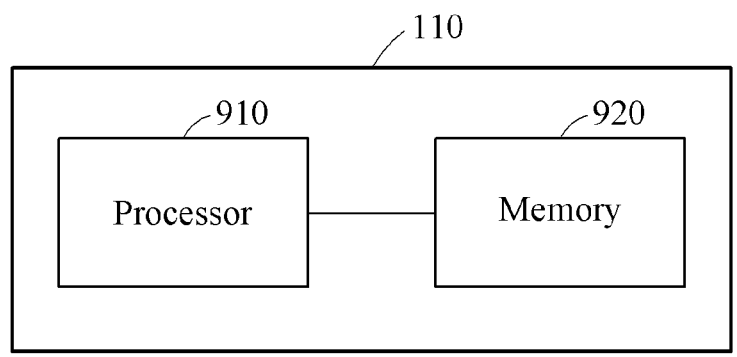
FIG. 9 illustrates an example of a battery state estimation apparatus.

FIG. 9 illustrates an example of a battery state estimation apparatus.

Referring to FIG. 9, the battery state estimation apparatus 110 includes a processor 910 and a memory 920.

The processor 910 implements the extractor 210, the estimators 220, and the integrators 710 through 730. The processor 910 sets a section in a sensing data sequence of the battery 120. The processor 910 extracts sensing data from the set section. The processor 910 determines a plurality of items of internal state information of the battery 120 based on the extracted sensing data using the estimators 220. Depending on examples, the processor 910 determines internal state information of a positive electrode and a negative electrode of the battery 120 individually. In this example, the processor 910 integrates the internal state information of the positive electrode and the internal state information of the negative electrode.

In an example, the processor 910 is a multi-core processor. In this example, multiple cores implement the estimators 220. The multiple cores implement, for example, the current density estimator 310, the potential estimator 320, and the ion density estimator 330 of FIGS. 3A and 3B, the estimators 410 through 460 of FIG. 4, a negative current density estimator 510, a positive current density estimator 520, a negative potential estimator 530, a positive potential estimator 540, a negative ion density estimator 550, and a positive ion density estimator 560 of FIG. 5, or the estimators 610, 611, 620, 621, 630, 631, 640, 641, 650, 651, 660, and 661. Using the multi-core processor, the plurality of items of internal state information of the battery 120 is determined in parallel and/or simultaneously and thus, an amount of time for determining the plurality of items of internal state information is reduced. Depending on examples, the battery state estimation apparatus 110 may include a plurality of processors and the processors implement the estimators 220.

The descriptions of FIGS. 1 through 8 are applicable here, and are incorporated herein by reference. Thus, the above description may not be repeated here.

The battery state estimation apparatus 110 is included in various electronic equipment, for example, a vehicle, a walking assistance device, a robot, and a mobile terminal, using the battery 120 as a power source. The battery state estimation apparatus 110 performs the operations described with reference to FIG. 1 through 9. The vehicle described herein refers to any mode of transportation, delivery, or communication such as, for example, an automobile, a truck, a tractor, a scooter, a motorcycle, a cycle, an amphibious vehicle, a snowmobile, a boat, a public transit vehicle, a bus, a monorail, a train, a tram, an autonomous or automated driving vehicle, an intelligent vehicle, a self-driving vehicle, an unmanned aerial vehicle, an electric vehicle (EV), a hybrid vehicle, or a drone.

The mobile terminals described herein refers to any devices such as, for example, an intelligent agent, a mobile phone, a cellular phone, a smart phone, a wearable smart device (such as, a ring, a watch, a pair of glasses, glasses-type device, a bracelet, an ankle bracket, a belt, a necklace, an earring, a headband, a helmet, a device embedded in the cloths, or an eye glass display (EGD)), a server, a personal computer (PC), a laptop, a notebook, a subnotebook, a netbook, an ultra-mobile PC (UMPC), a tablet personal computer (tablet), a phablet, a mobile internet device (MID), a personal digital assistant (PDA), an enterprise digital assistant (EDA), a digital camera, a digital video camera, a portable game console, an MP3 player, a portable/personal multimedia player (PMP), a handheld e-book, an ultra mobile personal computer (UMPC), a portable lab-top PC, a global positioning system (GPS) navigation, a personal navigation device, portable navigation device (PND), a handheld game console, an e-book, a high definition television (HDTV), a smart appliance, communication systems, image processing systems, graphics processing systems, various Internet of Things (IoT) devices that are controlled through a network, other consumer electronics/information technology (CE/IT) device, or any other device capable of wireless communication or network communication consistent with that disclosed herein. However, the mobile terminal is not limited to the examples described in the forgoing.

Hereinafter, an example of the battery state estimation apparatus 110 installed in a vehicle will be described with reference to FIG. 10. The following description is also applicable to other electronic equipment.

Figure 10:
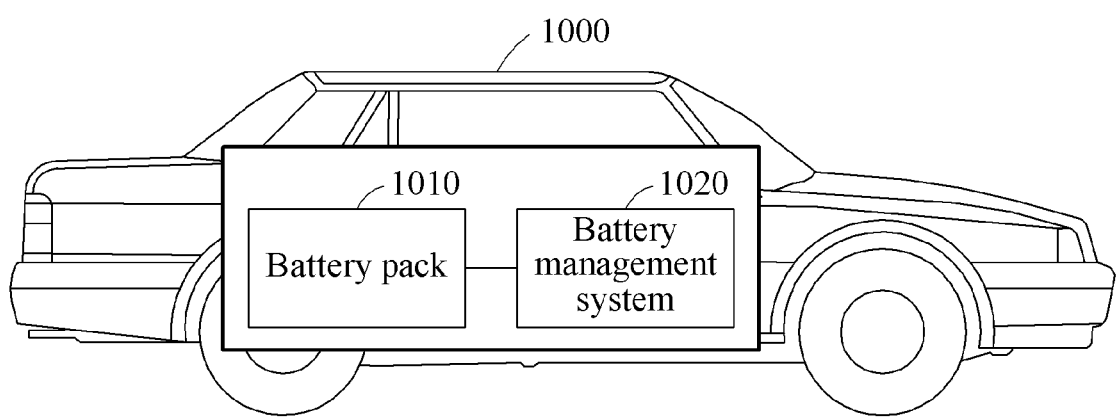
FIG. 10 illustrates an example of a vehicle.

FIG. 10 illustrates an example of a vehicle.

Referring to FIG. 10, a vehicle 1000 includes a battery pack 1010 and a battery management system (BMS) 1020. The vehicle 1000 uses the battery pack 1010 as a power source. The vehicle 1000 is, for example, an electric vehicle or a hybrid vehicle.

The battery pack 1010 includes at least one battery module. The battery module includes at least one battery cell.

The battery management system 1020 monitors whether an abnormality occurs in the battery pack 1010 and prevents the battery pack 1010 from being overcharged or overdischarged. The battery management system 1020 performs a thermal control on the battery pack 1010 when a temperature of the battery pack 1010 is higher than a first temperature, for example, 40° C. or lower than a second temperature, for example, −10° C. The battery management system 1020 performs a cell balancing such that states of charge of battery cells in the battery pack 1010 are equalized.

The battery management system 1020 includes the battery state estimation apparatus 110. The battery management system 1020 determines state information of the battery pack 1010 or state information of a battery cell included in the battery pack 1010 using the battery state estimation apparatus 110. The battery management system 1020 determines the state information of the battery pack 1010 or the state information of the battery cell included in the battery pack 1010 when the vehicle 1000 is travelling or the battery pack 1010 is partially charged and discharged.

The battery management system 1020 determines whether an internal state of each battery cell is abnormal based on any one or any combination of a plurality of items of internal state information about the corresponding battery cell. When it is determined that a battery cell is abnormal, the battery management system 1020 disallows the battery cell to be charged and discharged. The battery management system 1020 transmits information on the battery cell to an ECU or a VCU of the vehicle 1000. The ECU or the VCU of the vehicle 1000 displays information indicating that a presence of the battery cell determined to be abnormal on a display of the vehicle 1000.

Also, the battery management system 1020 estimates an SoC and/or an SoH of each battery cell based on any one or any combination of a plurality of items of internal state information about the corresponding battery cell. The battery management system 1020 estimates an SoC and/or an SoH of the battery pack 1010 based on the SoC and/or the SoH of each battery cell. The battery management system 1020 transmits the SoC and/or the SoH of the battery pack 1010 to the ECU or the VCU of the vehicle 1000. The ECU or the VCU of the vehicle 1000 displays the SoC and/or the SoH of the battery pack 1010 on a head-up display (HUD) of the vehicle 1000.

The description of FIGS. 1 through 9 is applicable here, and is incorporated herein by reference. Thus, the above description may not be repeated here.

Figure 11:
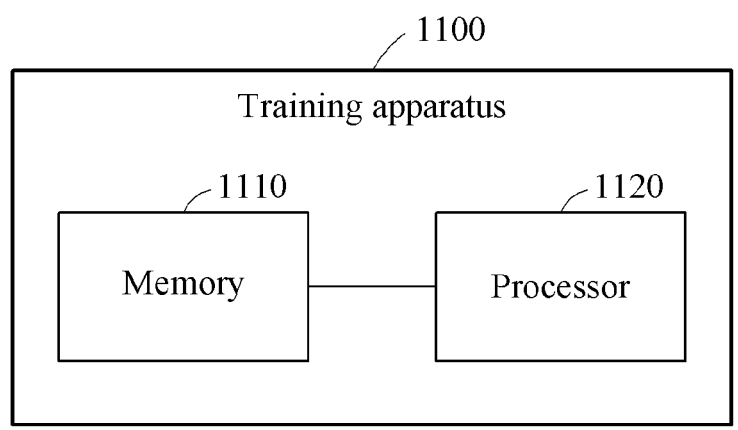
FIG. 11 illustrates an example of a training apparatus.

FIG. 11 illustrates an example of a training apparatus.

Referring to FIG. 11, a training apparatus 1100 includes a memory 1110 and a processor 1120.

The memory 1110 is connected to the processor 1120 and stores at least one instruction to be executed by the processor 1120. Also, the memory 1110 stores training data. The training data corresponds to, for example, sensing data included in a portion of a sensing data sequence of a reference battery charged based on a charging profile and/or sensing data included in a portion of a sensing data sequence of the reference battery discharged based on a discharging profile. In an example, the reference battery is the same type of battery as the battery 120.

The processor 1120 trains a neural network through a supervised learning based on the training data and reference data on internal variables of the reference battery. In an example, the internal variables of the reference battery include a current density, a potential, and an ion density of an electrode. For example, the processor 1120 trains a first neural network through the supervised learning based on the training data and reference data on the current density of the electrode. The trained first neural network is a basis of the current density estimator 310. Likewise, the processor 1120 trains a second neural network through the supervised learning based on the training data and reference data on the potential of the electrode and trains a third neural network through the supervised learning based on the training data and reference data on the potential of the electrode. In an example, the trained second neural network is a basis of the potential estimator 320. The trained third neural network is a basis of the ion density estimator 330.

In an example, the internal variables are classified based on charging and discharging of the reference battery. In an example, the internal variables include a current density, a potential, and an ion density of an electrode of the reference battery being charged and a current density, a potential, and an ion density of an electrode of the reference battery being discharged. The processor 1120 trains a neural network for each of the internal variables based on training data and reference data on the corresponding internal variable. In an example, the trained neural network is a basis of each of the estimators 410 through 460 of FIG. 4.

In an example, the internal variables of the reference battery are classified based on a negative electrode and a positive electrode. In this example, the internal variables include a current density, a potential, and an ion density of a negative electrode of the reference battery and a current density, a potential, and an ion density of a positive electrode of the reference battery. The processor 1120 trains a neural network for each of the internal variables based on training data and reference data on the corresponding internal variable. In an example, the trained neural network is a basis of each of the negative current density estimator 510, the positive current density estimator 520, the negative potential estimator 530, the positive potential estimator 540, the negative ion density estimator 550, and the positive ion density estimator 560 of FIG. 5.

In an example, the internal variables of the reference battery are classified based on a negative electrode and a positive electrode of the reference battery and charging and discharging of the reference battery. In this example, the internal variables include current densities, potentials, and ion densities of a negative electrode and a positive electrode of the reference battery being charged and current densities, potentials, and ion densities of a negative electrode and a positive electrode of the reference battery being discharged. The processor 1120 trains a neural network for each of the internal variables based on training data and reference data on the corresponding internal variable. The trained neural network is a basis of each of the estimators 610 through 661 of FIG. 6.

In related art, an electrochemical model calculates internal variables of a battery by cross-referencing the internal variables, for example, a current density of an electrode, a potential of the electrode, an ion density of the electrode, and an electrolyte ion density. In related art, the electrochemical model is unable to calculate a particular internal variable of the battery and there is a dependency between the different internal variables when calculating each of the internal variables. For this reason, the electrochemical model requires a large amount of calculations and a large amount of time for estimation. Also, when an error occurs in a process of calculation, the error is accumulated and spread due to the dependency and thus, an estimation accuracy is reduced.

The battery state estimation apparatus 110 uses an individual estimation model (, for example, each of the estimators 220) to calculate each of the internal variables (, for example, a current density of an electrode, a potential of the electrode, an ion density of the electrode, and an electrolyte ion density) of the battery 120. Also, the internal variables do not have a dependency in a process of calculation of the battery state estimation apparatus 110. As such, when calculating a predetermined internal variable, the battery state estimation apparatus 110 does not employ a calculation result of another internal variable. Thus, the battery state estimation apparatus 110 calculates each of the internal variables independently. The battery state estimation apparatus 110 calculates each of the internal variables with an increased speed. Also, the battery state estimation apparatus 110 calculates the internal variables in parallel.

The battery state estimation apparatus 110, extractor 210, estimators 220, current density estimator 310, potential estimator 320, and an ion density estimator 330, estimators 410, 420, and 430, estimators 440, 450, and 460, negative current density estimator 510, positive current density estimator 520, negative potential estimator 530, positive potential estimator 540, negative ion density estimator 550, positive ion density estimator 560, estimators 610, 611, 620, 621, 630, 631, estimators 640, 641, 650, 651, 660, 661, integrators 710 through 730, and training apparatus 1100, and other apparatuses, units, modules, devices, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In an example, the instructions or software includes at least one of an applet, a dynamic link library (DLL), middleware, firmware, a device driver, an application program storing the method of preventing the collision. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of estimating a state of a battery, the method comprising:
    setting a section in a sensing data sequence of a battery;
    extracting sensing data from the set section;
    determining items of internal state information of the battery using at least one processor-implemented estimator based on the extracted sensing data; and
    determining at least one of state of charging (SoC) information or state of health (SoH) information of the battery based on any one or any combination of the items of internal state information,
    wherein the determining of the items of internal state information further comprises:
    individually estimating current densities of a negative electrode of the battery and of a positive electrode of the battery, potentials of the negative electrode and the positive electrode, and ion densities of the negative electrode and the positive electrode, using the at least one processor-implemented estimator based on the extracted sensing data during a charging of the battery; and
    integrating the estimated current densities of the negative electrode and of the positive electrode, integrating the estimated potentials of the negative electrode and the positive electrode, and integrating the estimated ion densities of the negative electrode and the positive electrode.

2. The method of claim 1, wherein the at least one processor-implemented estimator comprise:
    a current density estimator configured to estimate a current density of the battery based on the extracted sensing data;
    a potential estimator configured to estimate a potential of the battery based on the extracted sensing data; and
    an ion density estimator configured to estimate an ion density of the battery based on the extracted sensing data.

3. The method of claim 1, wherein the at least one processor-implemented estimator comprise:
    a negative current density estimator configured to estimate a current density of the negative electrode of the battery based on the extracted sensing data;
    a positive current density estimator configured to estimate a current density of the positive electrode of the battery based on the extracted sensing data;
    a negative potential estimator configured to estimate a potential of the negative electrode based on the extracted sensing data;
    a positive potential estimator configured to estimate a potential of the positive electrode based on the extracted sensing data;
    a negative ion density estimator configured to estimate an ion density of the negative electrode based on the extracted sensing data; and
    a positive ion density estimator configured to estimate an ion density of the positive electrode based on the extracted sensing data.

4. The method of claim 1, wherein the at least one processor-implemented estimator comprise:
    discharged-state estimators configured to determine discharge-state items of internal state information of the battery from sensing data extracted from a sensing data sequence while the battery is discharged; and
    charged-state estimators configured to determine charge-state items of internal state information of the battery from sensing data extracted from a sensing data sequence while the battery is charged.

5. The method of claim 4, wherein:
    the discharged-state estimators comprise:

discharge-state current density estimators configured to estimate current densities of the negative electrode and the positive electrode of the battery while the battery is discharged;

discharge-state potential estimators configured to estimate potentials of the negative electrode and the positive electrode of the battery while the battery is discharged; and discharge-state ion density estimators configured to estimate ion densities of the negative electrode and the positive electrode of the battery while the battery is discharged, and the charged-state estimators comprise:

charge-state current density estimators configured to estimate current densities of a negative electrode and a positive electrode of the battery while the battery is charged;

charge-state potential estimators configured to estimate potentials of the negative electrode and the positive electrode of the battery while the battery is charged; and charge-state ion density estimators configured to estimate ion densities of the negative electrode and the positive electrode of the battery while the battery is charged.

6. The method of claim 1, wherein the at least one processor-implemented estimator is based on a neural network.

7. A non-transitory computer-readable storage medium storing instructions that, when executed by a processor, cause the processor to perform the method of claim 1.

8. The method of claim 1, wherein the determining of the internal state information comprises determining the internal state information in response to the battery being discharged based on:

individually estimating current densities of the negative electrode and the positive electrode of the battery, potentials of the negative electrode and the positive electrode, and ion densities of the negative electrode and the positive electrode using the at least one processor-implemented estimator based on sensing data extracted from a sensing data sequence during the discharging of the battery; and integrating the estimated current densities of the negative electrode and the positive electrode, integrating the estimated potentials of the negative electrode and the positive electrode, and integrating the estimated ion densities of the negative electrode and the positive electrode.

9. A method of estimating a state of a battery, the method comprising:

setting a section in a sensing data sequence of a battery;

extracting sensing data from the set section;

determining items of internal state information of the battery using at least one processor-implemented estimator based on the extracted sensing data; and determining at least one of state of charging (SoC) information or state of health (SoH) information of the battery based on any one or any combination of the items of internal state information, wherein the determining of the internal state information comprises determining the internal state information in response to the battery being discharged based on:

individually estimating current densities of the negative electrode and the positive electrode of the battery, potentials of the negative electrode and the positive electrode, and ion densities of the negative electrode and the positive electrode using the at least one processor-implemented estimator based on sensing data extracted from a sensing data sequence during the discharging of the battery; and integrating the estimated current densities of the negative electrode and the positive electrode, integrating the estimated potentials of the negative electrode and the positive electrode, and integrating the estimated ion densities of the negative electrode and the positive electrode.

10. An apparatus for estimating a state of a battery, the apparatus comprising:

a processor configured to:

set a section in a sensing data sequence of a battery;

extract sensing data from the set section;

determine items of internal state information of the battery using at least one processor-implemented estimator based on the extracted sensing data; and determine at least one of state of charging (SoC) information or state of health (SoH) information of the battery based on any one or any combination of the items of internal state information, wherein, for the determining of the items of internal state information, the processor is further configured to:

individually estimate current densities of a negative electrode of the battery and of a positive electrode of the battery, potentials of the negative electrode and the positive electrode, and ion densities of the negative electrode and the positive electrode, using the processor-implemented estimator based on the extracted sensing data; and integrate the estimated current densities of the negative electrode and the estimated current densities of the positive electrode, integrate the estimated potentials of the negative electrode and the positive electrode, and integrate the estimated ion densities of the negative electrode and the positive electrode.

11. The apparatus of claim 10, wherein the at least one processor-implemented estimator comprise:

a current density estimator configured to estimate a current density of the battery based on the extracted sensing data;

a potential estimator configured to estimate a potential of the battery based on the extracted sensing data; and an ion density estimator configured to estimate an ion density of the battery based on the extracted sensing data.

12. The apparatus of claim 10, wherein the at least one processor-implemented estimator comprise:

a negative current density estimator configured to estimate a current density of the negative electrode of the battery based on the extracted sensing data;

a positive current density estimator configured to estimate a current density of the positive electrode of the battery based on the extracted sensing data;

a negative potential estimator configured to estimate a potential of the negative electrode based on the extracted sensing data;

a positive potential estimator configured to estimate a potential of the positive electrode based on the extracted sensing data;

a negative ion density estimator configured to estimate an ion density of the negative electrode based on the extracted sensing data; and a positive ion density estimator configured to estimate an ion density of the positive electrode based on the extracted sensing data.

13. The apparatus of claim 10, wherein the at least one processor-implemented estimator comprise:
- discharged-state estimators configured to determine discharge-sate items of internal state information of the battery from sensing data extracted from a sensing data sequence while the battery is discharged; and
- charged-state estimators configured to determine charge-sate items of internal state information of the battery from sensing data extracted from a sensing data sequence while the battery is charged.

14. The apparatus of claim 13, wherein the discharged-state estimators comprise:
- discharge-sate current density estimators configured to estimate current densities of the negative electrode and the positive electrode of the battery while the battery is discharged;
- discharge-sate potential estimators configured to estimate potentials of the negative electrode and the positive electrode of the battery while the battery is discharged; and
- discharge-sate ion density estimators configured to estimate ion densities of the negative electrode and the positive electrode of the battery while the battery is discharged, and the charged-state estimators comprise:
- charge-sate current density estimators configured to estimate current densities of a negative electrode and a positive electrode of the battery while the battery is charged;
- charge-sate potential estimators configured to estimate potentials of the negative electrode and the positive electrode of the battery while the battery is charged; and
- charge-sate ion density estimators configured to estimate ion densities of the negative electrode and the positive electrode of the battery while the battery is charged.

15. The apparatus of claim 11, wherein the at least one processor-implemented estimator is based on a neural network.

16. An apparatus for estimating a state of a battery, the apparatus comprising:
- a processor configured to:
- set a section in a sensing data sequence of a battery;
- extract sensing data from the set section;
- determine items of internal state information of the battery using at least one processor-implemented estimator based on the extracted sensing data; and
- determine at least one of state of charging (SoC) information or state of health (SoH) information of the battery based on any one or any combination of the items of internal state information,
- wherein in response to the battery being discharged, the processor is further configured to:
- individually estimate current densities of the negative electrode and the positive electrode of the battery, potentials of the negative electrode and the positive electrode, and ion densities of the negative electrode and the positive electrode using the at least one processor-implemented estimator based on sensing data extracted from a sensing data sequence during the discharging of the battery; and
- integrate the estimated current densities of the negative electrode and the positive electrode, integrate the estimated potentials of the negative electrode and the positive electrode, and integrate the estimated ion densities of the negative electrode and the positive electrode.

17. The apparatus of claim 10, wherein the processor is further configured to normalize and filter the extracted sensing data.

18. The apparatus of claim 10, wherein the processor is further configured to determine that the battery is charged based on a current value in the extracted sensing data being greater than or equal to a threshold.

19. The apparatus of claim 10, wherein the processor is further configured to determine that the battery is discharged based on a current value in the extracted sensing data being lesser than a threshold.

20. The apparatus of claim 10, wherein the processor is further configured to determine the charge state of the battery, in response to receiving a signal from another device.

21. The apparatus of claim 15, further comprising:
- a memory configured to store training data to train the neural network through supervised learning based on the training data and reference data on internal variables of a reference battery.

22. The apparatus of claim 10, wherein in response to the battery being discharged, the processor is further configured to:
- individually estimate current densities of the negative electrode and the positive electrode of the battery, potentials of the negative electrode and the positive electrode, and ion densities of the negative electrode and the positive electrode using the at least one processor-implemented estimator based on sensing data extracted from a sensing data sequence during the discharging of the battery; and
- integrate the estimated current densities of the negative electrode and the positive electrode, integrate the estimated potentials of the negative electrode and the positive electrode, and integrate the estimated ion densities of the negative electrode and the positive electrode.

* * * * *